United States Patent
Ueda

(10) Patent No.: US 10,672,448 B2
(45) Date of Patent: Jun. 2, 2020

(54) MAGNETIC STORAGE DEVICE

(71) Applicant: TOSHIBA MEMORY CORPORATION, Tokyo (JP)

(72) Inventor: Yoshihiro Ueda, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/296,376

(22) Filed: Mar. 8, 2019

(65) Prior Publication Data

US 2020/0082864 A1    Mar. 12, 2020

(30) Foreign Application Priority Data

Sep. 12, 2018 (JP) .................. 2018-170481

(51) Int. Cl.
| | | |
|---|---|---|
| *G11C 11/16* | (2006.01) | |
| *H01L 43/02* | (2006.01) | |
| *H01L 27/22* | (2006.01) | |
| *H01L 43/08* | (2006.01) | |

(52) U.S. Cl.
CPC ...... *G11C 11/1675* (2013.01); *G11C 11/1655* (2013.01); *G11C 11/1659* (2013.01); *G11C 11/1673* (2013.01); *H01L 27/224* (2013.01); *H01L 43/02* (2013.01); *H01L 43/08* (2013.01)

(58) Field of Classification Search
CPC .............................. G11C 11/16; G11C 11/161
USPC .................................................. 365/158, 173
See application file for complete search history.

(56) References Cited

U.S. PATENT DOCUMENTS

| | | | |
|---|---|---|---|
| 6,111,784 A * | 8/2000 | Nishimura | ........... G11C 11/1675 365/173 |
| 6,141,470 A * | 10/2000 | Espindola | .............. G02B 6/022 385/24 |
| 6,990,004 B2 | 1/2006 | Iwata | |
| 7,064,975 B2 | 6/2006 | Iwata | |
| 9,275,746 B2 | 3/2016 | Jeon et al. | |
| 9,484,087 B2 * | 11/2016 | Lee | ...................... G11C 11/5685 |
| 9,830,968 B2 * | 11/2017 | Shimomura | .......... G11C 11/161 |
| 9,997,239 B1 * | 6/2018 | Alam | .................. G11C 11/1675 |
| 2003/0123271 A1 | 7/2003 | Iwata | |
| 2005/0083730 A1 | 4/2005 | Iwata | |

(Continued)

FOREIGN PATENT DOCUMENTS

| | | |
|---|---|---|
| JP | 2003-249073 A | 9/2003 |
| JP | 2019-164848 A | 9/2019 |

*Primary Examiner* — Michael T Tran
(74) *Attorney, Agent, or Firm* — Finnegan, Henderson, Farabow, Garrett & Dunner, L.L.P.

(57) ABSTRACT

According to an embodiment, a magnetic storage device includes a memory unit, a current supply circuit, a switch, and a controller. The memory unit includes a magnetic member and a switch element. The switch element is connected in series to the magnetic member, and changes to an on state in a case where a voltage equal to or larger than a predetermined value is applied in an off state. The current supply circuit supplies a current to the memory unit. The switch electrically connects or disconnects the current supply circuit and the memory unit. The controller applies a voltage for changing the switch element from the off state to the on state to the memory unit with the switch in a disconnected state, and sets the switch to be in a connected state after the switch element changes to the on state.

20 Claims, 15 Drawing Sheets

(56) References Cited

U.S. PATENT DOCUMENTS

| | | | | |
|---|---|---|---|---|
| 2005/0107870 A1* | 5/2005 | Wang | ............... | A61L 31/10 |
| | | | | 623/1.44 |
| 2006/0031595 A1* | 2/2006 | Vorbach | ............ | G06F 15/7867 |
| | | | | 710/8 |
| 2011/0240468 A1* | 10/2011 | Hollars | ............ | C23C 14/3407 |
| | | | | 204/298.16 |
| 2012/0319076 A1* | 12/2012 | Lee | ............... | G11C 11/5685 |
| | | | | 257/5 |
| 2013/0064009 A1* | 3/2013 | Kitano | ............ | G11C 19/0841 |
| | | | | 365/158 |
| 2014/0246643 A1* | 9/2014 | Kim | ............... | H01L 27/2436 |
| | | | | 257/4 |
| 2016/0125994 A1* | 5/2016 | Mair | ............... | B82B 3/0066 |
| | | | | 335/284 |
| 2016/0225818 A1* | 8/2016 | Toh | ............... | G11C 11/1675 |
| 2016/0267955 A1 | 9/2016 | Iwata | | |
| 2018/0096982 A1 | 4/2018 | Schafer | | |
| 2019/0287593 A1 | 9/2019 | Ueda | | |
| 2020/0004703 A1* | 1/2020 | Sankaran | ............ | G06F 13/1668 |

* cited by examiner

MAGNETIC STORAGE DEVICE

CROSS-REFERENCE TO RELATED APPLICATIONS

This application is based upon and claims the benefit of priority from Japanese Patent Application No. 2018-170481, filed on Sep. 12, 2018; the entire contents of which are incorporated herein by reference.

FIELD

Embodiments described herein relate generally to a magnetic storage device.

BACKGROUND

Magnetic storage devices using magnetic members have been proposed. Further, there are also known storage devices using a selector element between two terminals that changes from an off state to an on state in a case where a voltage equal to or larger than a predetermined value is applied. In such a storage device, a large spike current occurs when the selector element between two terminals changes from the off state to the on state.

In the magnetic storage device using a magnetic member, there is a possibility of erroneously shifting retained magnetic domains if a large spike current flows through the magnetic member. In the magnetic storage device using a magnetic member, information cannot be accurately written or read if the magnetic domains retained in the magnetic member are erroneously shifted.

DETAILED DESCRIPTION

Figure 1:
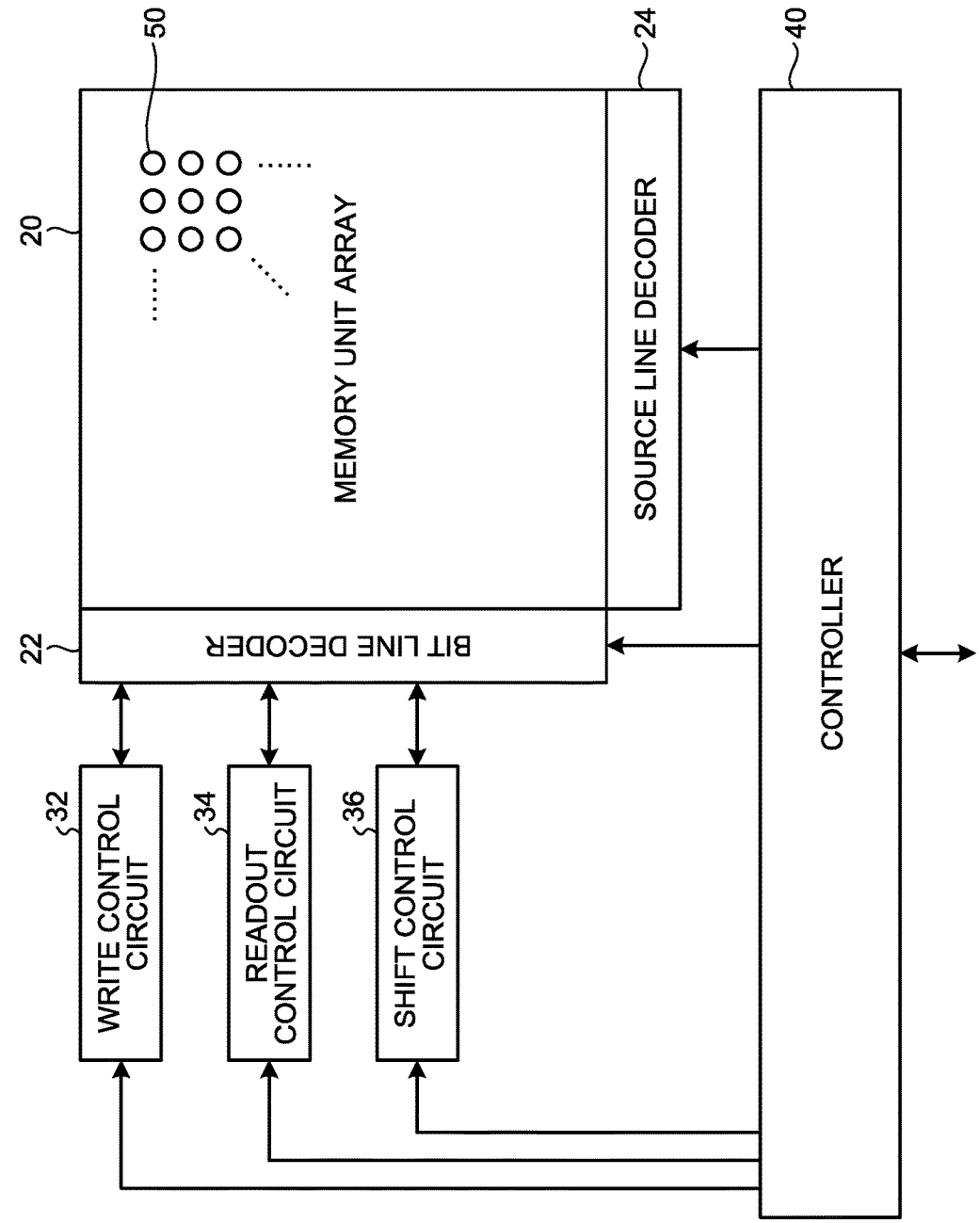
FIG. 1 is a diagram illustrating a configuration of a magnetic storage device according to an embodiment.

In general, according to one embodiment, a magnetic storage device is provided. The magnetic storage device includes a memory unit, a current supply circuit, a switch, and a controller. The memory unit includes a magnetic member and a switch element. The magnetic member includes a portion extending in a direction. The switch element is connected in series to the magnetic member, and changes to an on state in a case where a voltage equal to or larger than a predetermined value is applied in an off state. The current supply circuit supplies a current to the memory unit. The switch electrically connects or disconnects the current supply circuit and the memory unit. The controller applies a voltage for changing the switch element from the off state to the on state to the memory unit with the switch in a disconnected state, and sets the switch to be in a connected state after the switch element changes to the on state.

Exemplary embodiments of a magnetic storage device will be described below in detail with reference to the accompanying drawings. In the following description, constituent elements having the same function and configuration are denoted by the same reference numeral. In addition, each of the embodiments described below exemplifies a device and a method for embodying the technical idea of this embodiment, and does not specify the material, shape, structure, arrangement, and the like of constituent parts to those set as follows.

FIG. 1 is a diagram illustrating a configuration of a magnetic storage device 10 according to an embodiment. The magnetic storage device 10 is a storage device realized by a semiconductor device. The magnetic storage device 10 according to the embodiment is referred to as, for example, a magnetic domain wall displacement memory.

The magnetic storage device 10 is connected to an information processing circuit and the like via a bus or the like. The magnetic storage device 10 internally stores recording information received from the information processing circuit in response to an instruction from the information processing circuit. Further, the magnetic storage device 10 outputs the information stored therein to the information processing circuit in response to an instruction from the information processing circuit.

The magnetic storage device 10 includes a memory unit array 20, a bit line decoder 22, a source line decoder 24, a write control circuit 32, a readout control circuit 34, a shift control circuit 36, and a controller 40.

The memory unit array 20 includes a plurality of bit lines BL, a plurality of source lines SL, and a plurality of field lines FL. The memory unit array 20 further includes a plurality of memory units 50 arranged in a matrix manner. Each of the plurality of memory units 50 magnetically stores information. Furthermore, each of the plurality of memory units 50 can retain and shift a magnetization state, using the principle of magnetic domain wall displacement. Note that further details of the memory unit 50 will be described below.

The bit line decoder 22 selects the bit line BL to which the memory unit 50 to be written or read is connected according to the control of the controller 40. The source line decoder 24 selects the source line SL to which the memory unit 50 to be written or read is connected according to the control by the controller 40.

The write control circuit 32 writes the recording information in the target memory unit 50 selected by the bit line decoder 22 and the source line decoder 24 according to the control of the controller 40 at the time of writing. The readout control circuit 34 reads information from the target memory unit 50 selected by the bit line decoder 22 and the source line decoder 24 according to the control of the controller 40 at the time of reading. The shift control circuit 36 shifts magnetic domains retained by the target memory unit 50 selected by the bit line decoder 22 and the source line decoder 24 according to the control of the controller 40 before writing or reading. Note that further details of write processing, readout processing, and shift processing will be described below.

The controller 40 receives a readout command, a write command, or the like from the information processing circuit connected via the bus or the like. The controller 40 controls the bit line decoder 22, the source line decoder 24, the write control circuit 32, the readout control circuit 34, and the shift control circuit 36 according to the received command. As a result, the controller 40 can write and read information to and from the selected memory unit 50 among the plurality of memory units 50 included in the memory unit array 20.

Figure 2:
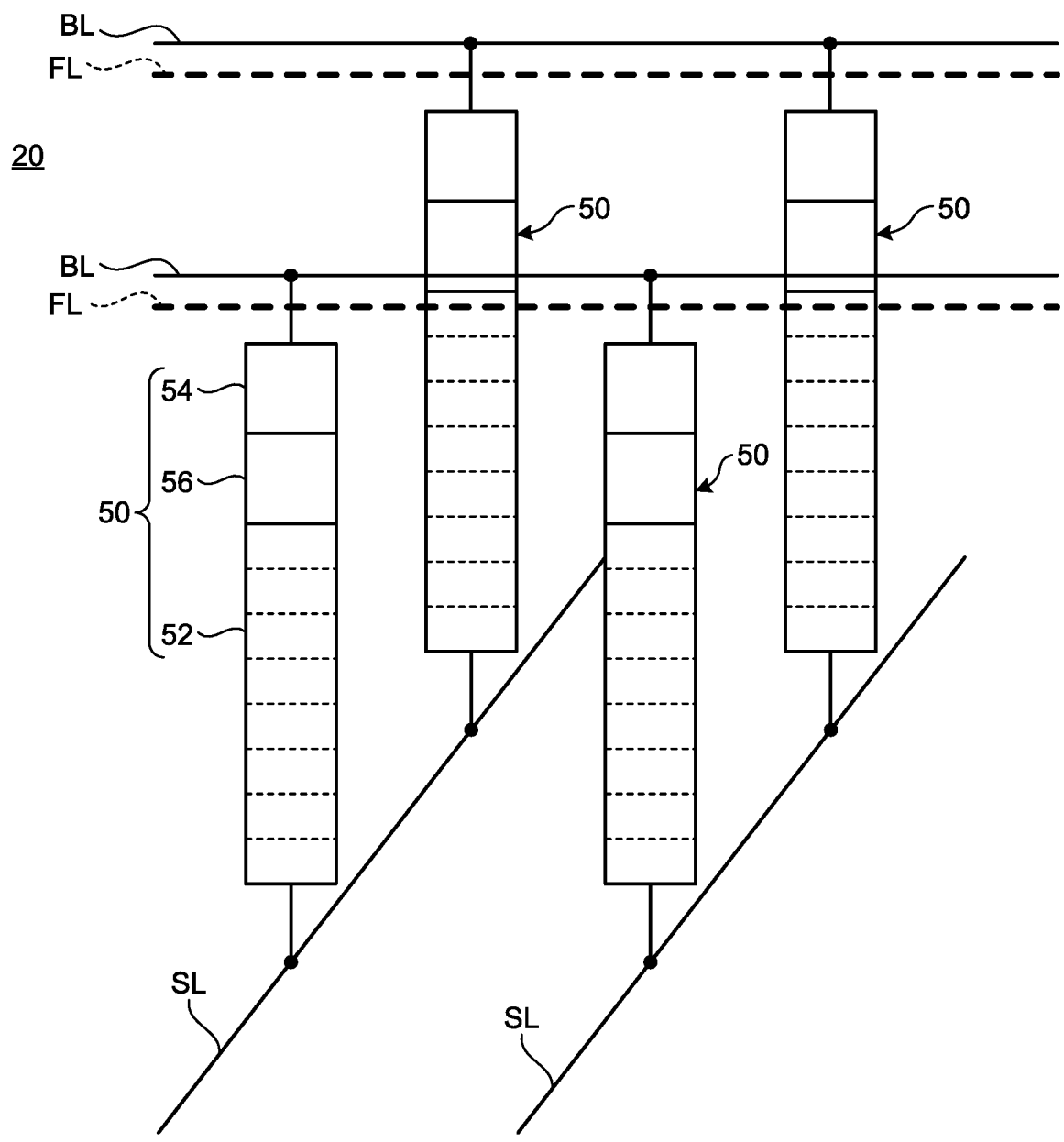
FIG. 2 is a diagram illustrating a configuration of a part of a memory unit array.

FIG. 2 is a diagram illustrating a configuration of a part of a memory unit array 20.

Each of the plurality of bit lines BL is substantially linear wiring formed in a predetermined layer in the semiconductor device. The plurality of bit lines BL is formed in parallel at equal intervals. For example, each bit line BL is formed to extend in an X direction.

Each of the plurality of source lines SL is linear wiring formed in a predetermined layer different from the layer in which the bit lines BL are formed in the semiconductor device. The plurality of source lines SL is arranged in parallel at equal intervals in a direction orthogonal to the plurality of bit lines BL. For example, each source line SL is formed to extend in a Y direction orthogonal to the X direction. For example, the plurality of source lines SL is formed in a layer different from the plurality of bit lines BL in a Z direction orthogonal to the X direction and the Y direction.

The plurality of field lines FL is wiring formed in a predetermined layer different from the layers in which the bit lines BL and the source lines SL are formed in the semiconductor device. The plurality of field lines FL is provided on a one-to-one basis with, for example, the plurality of bit lines BL. The plurality of field lines FL is arranged in parallel at equal intervals in the same direction as the plurality of bit lines BL. For example, each field line FL is formed to extend in the X direction. For example, the plurality of source lines SL is formed in a layer different from the layers of the plurality of bit lines BL and the plurality of source lines SL in the Z direction.

The plurality of memory units 50 is arranged in a matrix manner with respect to an X-Y plane. The plurality of memory units 50 is formed in a layer between the layer in which the plurality of bit lines BL is formed and the layer in which the plurality of source lines SL is formed. Each of the plurality of memory units 50 is provided at an intersection point between the bit line BL and the source line SL in the X-Y plane. Each of the plurality of memory units 50 has an elongated shape in the Z direction, and one end of the memory unit 50 is electrically connected to the corresponding bit line BL and the other end of the memory unit 50 is electrically connected to the corresponding source line SL. Further, each of the plurality of memory units 50 is magnetically connected to one of the plurality of field lines FL.

Each memory unit 50 includes a magnetic member 52 (MML), a selector element 54 (switch element), and a magnetoresistance effect element 56.

The magnetic member 52 is a linear ferromagnetic member. The magnetic member 52 is arranged to extend in the direction (Z direction) orthogonal to both the bit line BL and the source line SL.

The magnetic member 52 can retain a plurality of magnetic domains in the length direction (Z direction). Each of the magnetic domains is magnetized in one of a first direction and a second direction opposite to the first direction according to stored information. The magnetic member 52 shifts the retained magnetic domain in the length direction (Z direction) in response to the current flowing in the length direction (Z direction).

One end of the magnetic member 52 in the Z direction is electrically connected to the corresponding one source line SL. Further, the other end (an opposite end portion of the source line SL) of the magnetic member 52 in the Z direction can be electrically connected to the corresponding one bit line BL via the selector element 54 and the magnetoresistance effect element 56. Therefore, in a case where the selector element 54 is in an on state, the magnetic member 52 can move the retained magnetic domain in the length direction (Z direction) as the current is supplied from the corresponding bit line BL and the corresponding source line SL.

The selector element 54 is a two-terminal element connected in series to the magnetic member 52. More specifically, one end of the selector element 54 in the Z direction is electrically connected to the corresponding one bit line BL, and the other end is connected to an end portion of the magnetic member 52 on the side where the source line SL is not connected, via the magnetoresistance effect element 56.

The selector element 54 switches the state between the two terminals to an off state (high resistance state and non-conduction state) or an on state (low resistance state and conduction state). The selector element 54 is switched to the off state or the on state according to the voltage applied between the two terminals and the current flowing between the two terminals. In the case where the selector element 54 is in the off state, no current flows through the magnetic members 52 connected in series. In the case where the selector element 54 is in the on state, a current flows through the magnetic member 52 connected in series.

The selector element 54 changes to the on state when a voltage equal to or larger than a predetermined value is applied in the off state. Further, the selector element 54 maintains the on state in a case where a current equal to or larger than the holding current value ($I_{hold}$) continues to flow in the on state.

The selector element 54 may be, for example, a switch element between two terminals. In a case where the voltage to be applied between the two terminals is equal to or smaller than a threshold value, the switch element between two terminals is in the "high resistance" state, for example, is electrically in the non-conduction state. In a case where the voltage to be applied between the two terminals is equal to or larger than the threshold value, the switch element between two terminals changes to the "low resistance" state, for example, is electrically in the conduction state. The switch element between two terminals may have this function with either polarity of voltage. The switch element between two terminals may contain at least one type of chalcogen element selected from the group consisting of Te, Se, and S. Alternatively, the switch element between two terminals may contain chalcogenide that is a compound containing such a chalcogen element. The switch element between two terminals may also contain at least one type of element selected from the group consisting of B, Al, Ga, In, C, Si, Ge, Sn, As, P, and Sb.

The magnetoresistance effect element 56 is provided between the selector element 54 and the magnetic member 52. The magnetoresistance effect element 56 has conductivity. Therefore, the selector element 54 and the magnetic member 52 are electrically connected. With the electrical connection, in the case where the selector element 54 is in the on state, one end of the magnetic member 52 is electrically connected to the corresponding bit line BL via the selector element 54 and the magnetoresistance effect element 56.

In the magnetoresistance effect element 56, a resistance value varies according to a stored magnetization direction. In the present embodiment, the magnetoresistance effect element 56 is a magnetic tunnel junction (MTJ) element.

Figure 3:
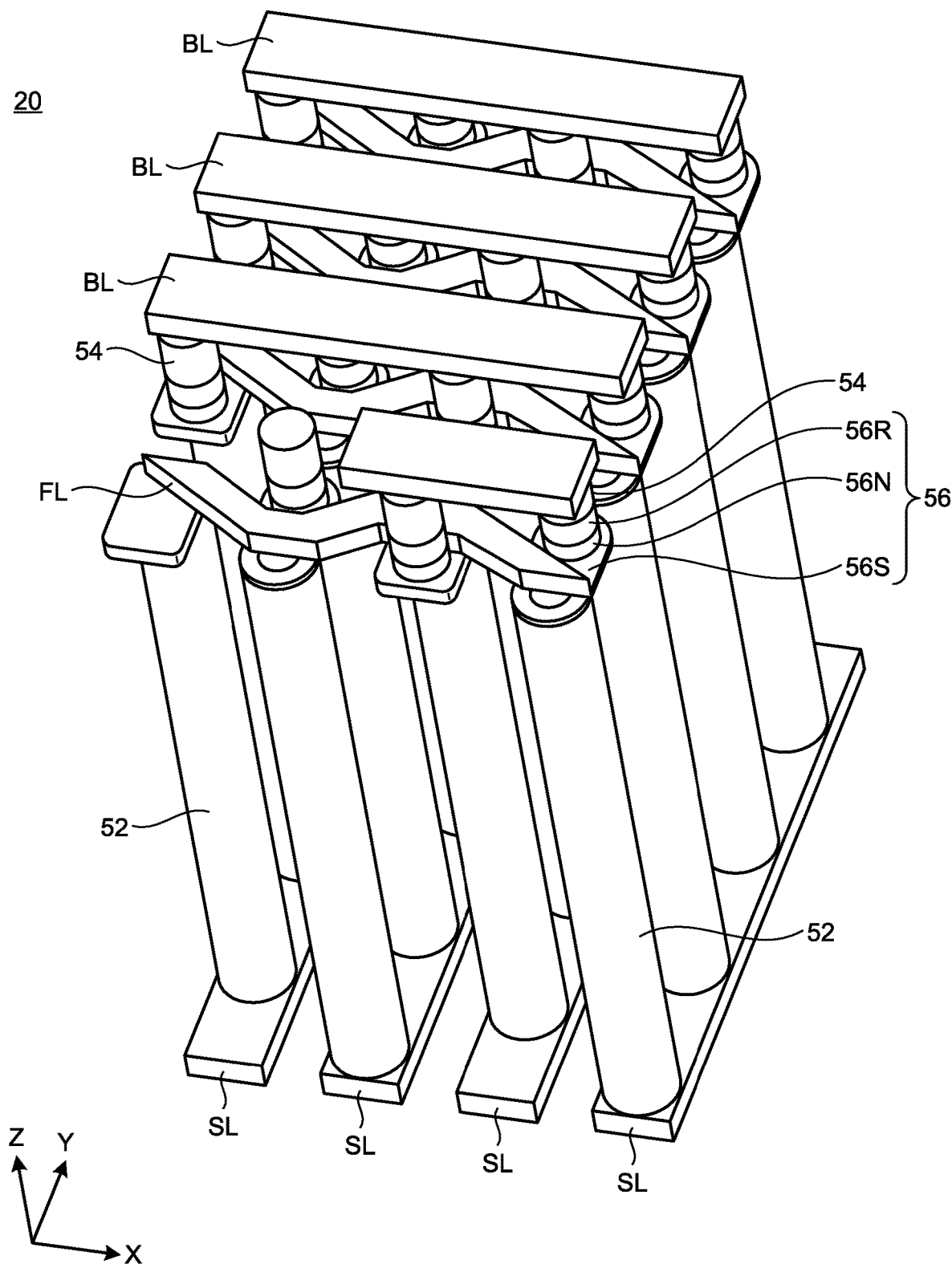
FIG. 3 is a perspective view schematically illustrating a structure of a part of the memory unit array.

FIG. 3 is a perspective view schematically illustrating a structure of a part of the memory unit array 20. The magnetic member 52 has, for example, a cylindrical shape. In the present embodiment, the magnetic member 52 has a shape with a hollow interior, but the magnetic member 52 may have a columnar shape without a hollow interior or may not have the cylindrical shape or the columnar shape.

One bottom surface of the magnetic member 52 is connected to one of the source lines SL. A bottom surface of the magnetic member 52 on the side opposite to the source line SL is connected to the magnetoresistance effect element 56.

The magnetoresistance effect element 56 includes a first magnetic layer 56S (memory layer), a nonmagnetic layer 56N, and a second magnetic layer 56R (reference layer). The first magnetic layer 56S is in contact with the bottom surface of the magnetic member 52 on the side where the source line SL is not connected. The second magnetic layer 56R is in contact with the selector element 54. The nonmagnetic layer 56N is arranged between the first magnetic layer 56S and the second magnetic layer 56R.

The first magnetic layer 56S is magnetized in a direction (an in-plane direction of an X-Y plane) parallel to a boundary surface between the first magnetic layer 56S, and the nonmagnetic layer 56N and the second magnetic layer 56R. At the time of reading, the magnetization direction of the first magnetic layer 56S is reversed according to the magnetization direction of the magnetic domain retained in the end portion of the magnetic member 52 on the side of the magnetoresistance effect element 56. The nonmagnetic layer 56N functions as a tunnel barrier.

The second magnetic layer 56R has magnetization in a fixed or unchanged direction, and has, for example, a coercive force larger than a coercive force of the first magnetic layer 56S. The magnetization direction of the second magnetic layer 56R is not reversed depending on the magnetization direction of the first magnetic layer 56S and the magnetization direction of the magnetic domain of the magnetic member 52. Here, the direction being fixed or unchanged means that the magnetization direction does not change with respect to a predetermined shift write current.

A set of the second magnetic layer 56R, the nonmagnetic layer 56N, and the first magnetic layer 56S exhibits the magnetoresistance effect. More specifically, when the magnetization direction of the first magnetic layer 56S and the magnetization direction of the second magnetic layer 56R are parallel and antiparallel, the set of the second magnetic layer 56R, the nonmagnetic layer 56N, and the first magnetic layer 56S exhibits minimum and maximum resistance values, respectively. In the case where the magnetization directions of the first magnetic layer 56S and the second magnetic layer 56R are parallel (in the same direction), the magnetoresistance effect element 56 is in the low resistance state, and in the case where the magnetization directions of the first magnetic layer 56S and the second magnetic layer 56R are antiparallel (in the opposite directions), the magnetoresistance effect element 56 is in the high resistance state.

The magnetization direction of the first magnetic layer 56S varies depending on the magnetization direction of the magnetic domain retained in the end portion (readout position) of the magnetic member 52 on the side of the magnetoresistance effect element 56. Therefore, the resistance value of the magnetoresistance effect element 56 varies depending on the magnetization direction retained by the magnetic domain in the end portion of the magnetic member 52 on the side of the magnetoresistance effect element 56. As a result, the magnetoresistance effect element 56 can function as a readout element that reads the magnetization direction of the magnetic domain retained at the readout position on the magnetic member 52. Note that the magnetoresistance effect element 56 may include further layers.

In addition, the bottom surface of the magnetic member 52, and the second magnetic layer 56R and the nonmagnetic layer 56N have different formation ranges in the X-Y plane. The first magnetic layer 56S is formed in a range including all of a region in contact with the bottom surface of the magnetic member 52 and a region in contact with the second magnetic layer 56R and the nonmagnetic layer 56N in the X-Y plane.

The field line FL is formed to pass through a region directly above the bottom surface of the cylindrical magnetic member 52 on the side opposite to the source line SL. Therefore, the end portion of the magnetic member 52 on the side of the magnetoresistance effect element 56 is in proximity to the source line SL via the first magnetic layer 56S. Therefore, a magnetic field generated by the current flowing through the field line FL is applied to the end portion of the magnetic member 52 on the side of the magnetoresistance effect element 56 via the first magnetic layer 56S.

In a case where a magnetic field generated by the current flowing through the field line FL is applied, a new magnetic domain is written in the end portion (write position) of the magnetic member 52 on the side of the magnetoresistance effect element 56 by an induction magnetic field. The new magnetic domain written in the end portion of the magnetic member 52 on the side of the magnetoresistance effect element 56 is magnetized in a direction according to the direction of the write current flowing through the field line FL. In this manner, the field line FL and the first magnetic layer 56S can function as a write element that writes the magnetic domain in the magnetization direction according to the recording information to the write position in the magnetic member 52.

Figure 4:
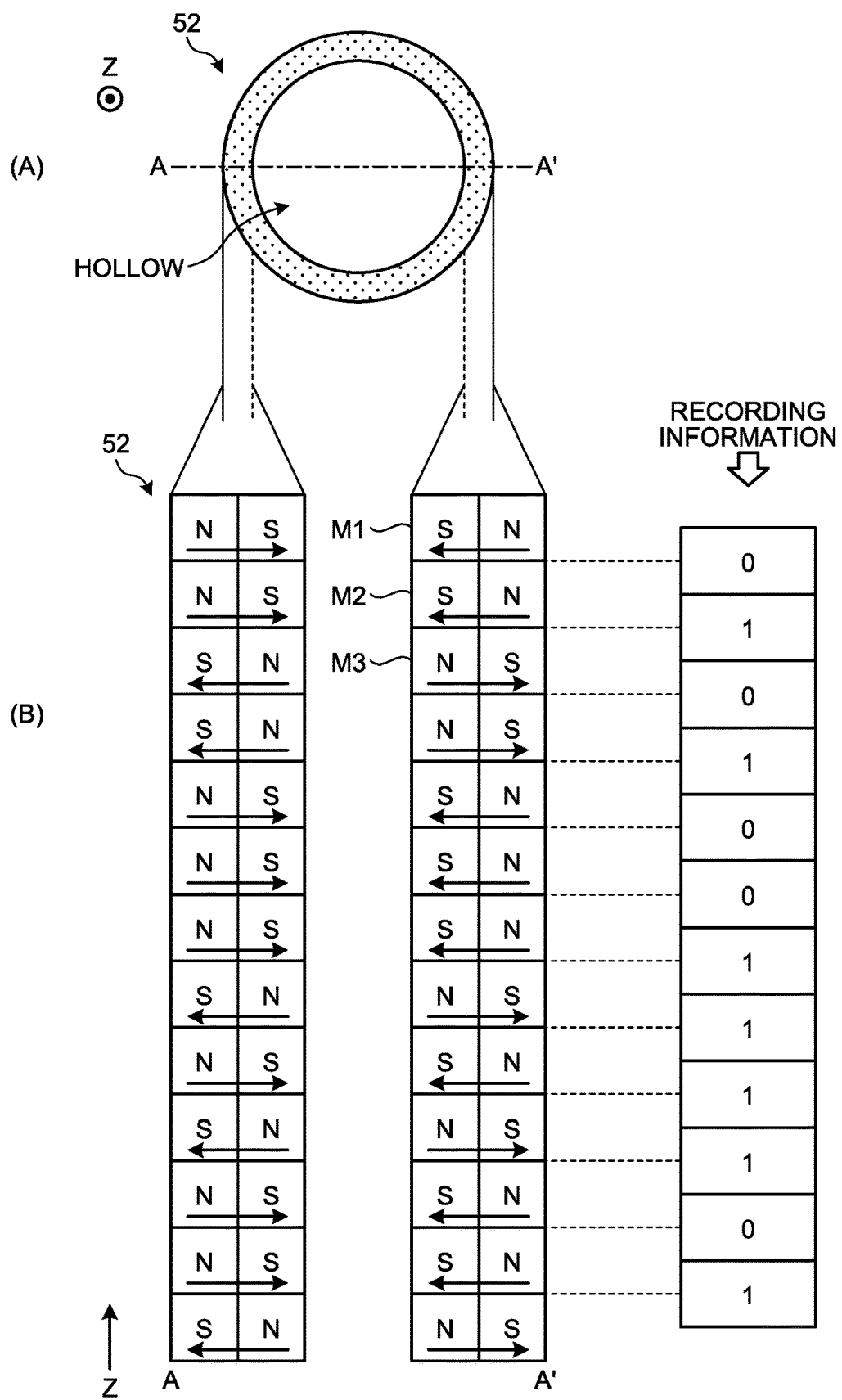
FIG. 4 is a diagram illustrating an example of magnetic domains and recording information retained by a magnetic member.

FIG. 4 is a diagram illustrating an example of magnetic domains and recording information retained by the magnetic member 52. More specifically, a section (A) in FIG. 4 is a schematic diagram of the magnetic member 52 as viewed from the Z direction. A section (B) in FIG. 4 illustrates an example of magnetization directions of a plurality of magnetic domains retained in a region cut by line A-A' in the section (A) in FIG. 4 in the magnetic member 52, and the recording information indicated by the magnetization directions of the plurality of magnetic domains.

The magnetic member 52 can retain a plurality of magnetic domains along the length direction (Z direction). Note that, in the section (B) in FIG. 4, the upper side in the figure is in contact with the magnetoresistance effect element 56. In the example of the section (B) in FIG. 4, the magnetic member 52 retains magnetic domains M1, M2, M3, ..., and the like from the side of the magnetoresistance effect element 56.

Each magnetic domain is magnetized in the first direction or the second direction opposite to the first direction. As illustrated in FIG. 4, each magnetic domain has a magnetization direction formed in the order of the N pole and the S pole from an outer circumference side, and has, on the contrary, a magnetization direction formed in the order of the S pole and the N pole from the outer circumference side. Note that the magnetization direction of each magnetic domain may be perpendicular to the length direction (Z direction) of the magnetic member 52 (perpendicular magnetic film), or may be the length direction (Z direction) of the magnetic member 52 (in-plane magnetic film).

For example, in a case where the magnetization directions of two magnetic domains adjacent in the length direction (Z direction) of the magnetic member 52 are the same, the magnetic member 52 stores first data in the two magnetic domains. In a case where the magnetization directions of two adjacent magnetic domains are different, the magnetic member 52 stores second data different from the first data in the two magnetic domains. For example, the magnetic member 52 stores "0" in the two magnetic domains in the case where the magnetization directions of the two adjacent magnetic domains are the same. For example, the magnetic member 52 stores "1" in the two magnetic domains in the case where the magnetization directions of the two adjacent magnetic domains are different.

In a case where the magnetization directions of two adjacent magnetic domains are different as in M2 and M3, a magnetic domain wall is generated between the magnetic domain and the magnetic domain. However, in the case where the magnetization directions of adjacent magnetic domains are the same as in M1 and M2, no magnetic domain wall is generated between the magnetic domain and the magnetic domain.

Figure 5:
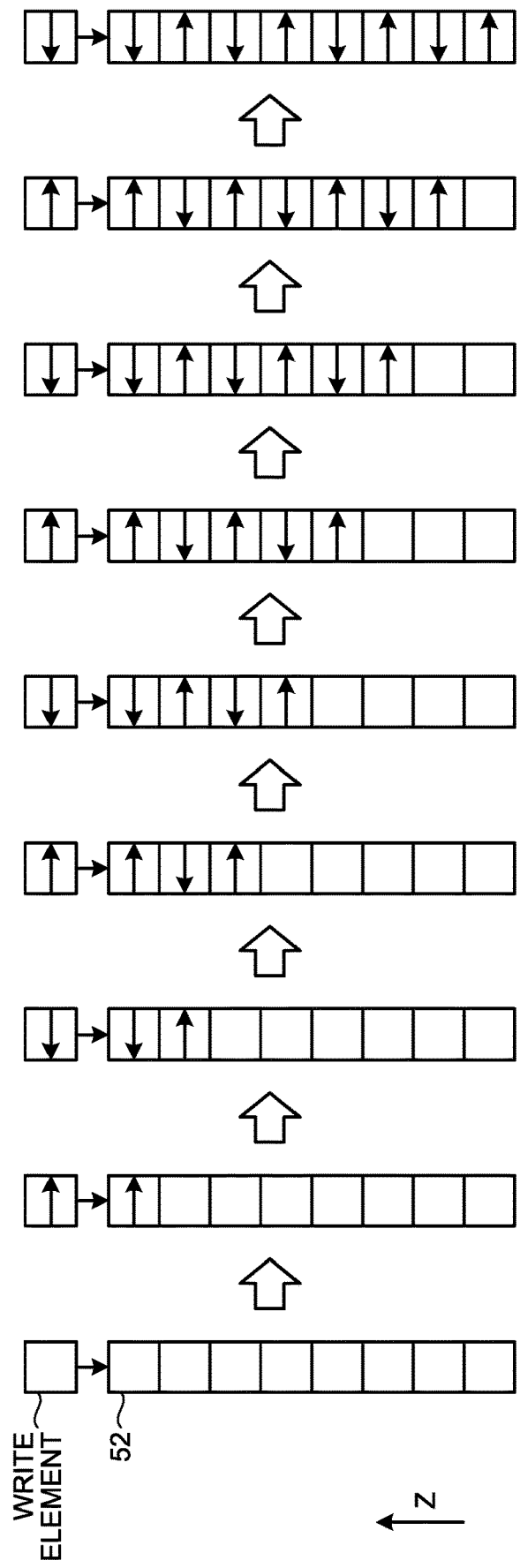
FIG. 5 is a diagram illustrating a shift example of the magnetic domains at the time of writing.

FIG. 5 illustrates an example of the magnetic domains retained in the magnetic member 52 at the time of writing. The magnetic member 52 shifts the retained magnetic domains along the length direction (Z direction). More specifically, in a case where the shift pulse current is supplied once, the magnetic member 52 shifts all the retained magnetic domains by one magnetic domain in the length direction.

In the magnetic member 52, one magnetic domain in the magnetization direction according to the write current is written to the write position (the end portion on the side of the write element) by single write processing. After the write processing is completed once, the shift pulse current for shifting all the retained magnetic domains in a direction away from the write position is supplied to the magnetic member 52. As a result, the magnetic member 52 can be emptied at the write position, and becomes able to write a next new valid magnetic domain.

Thereafter, the write processing and the supply of the shift pulse current are alternately performed in the magnetic member 52. Then, when the initially written magnetic domain reaches the end portion (tail position) of the magnetic member 52 on the opposite side of the write element, a new magnetic domain can no longer be written, to the magnetic member 52.

As described above, a new magnetic domain is written to the write position in the magnetic member 52 while the already written magnetic domains are shifted in the direction toward the tail position.

Figure 6:
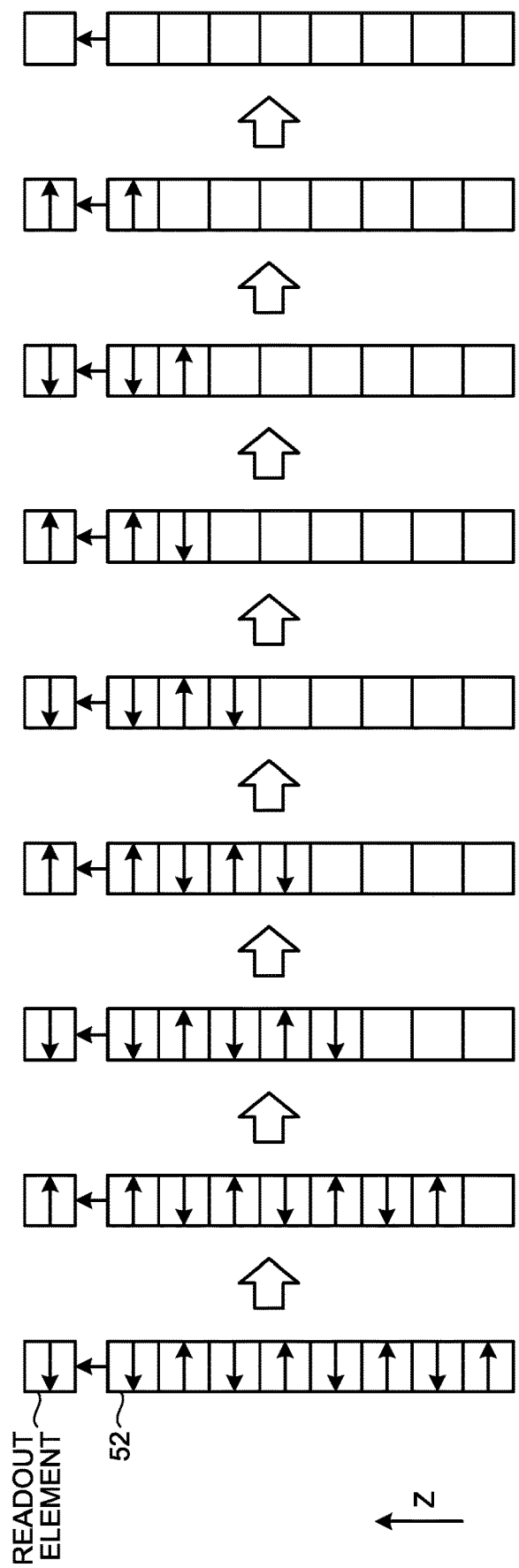
FIG. 6 is a diagram illustrating a shift example of the magnetic domains at the time of reading.

FIG. 6 illustrates an example of the magnetic domains retained in the magnetic member 52 at the time of reading.

In the magnetic member 52, the magnetization direction of one magnetic domain retained at the readout position (the end portion on the side of the readout element) is read by single readout processing. After the readout processing is completed once, the shift pulse current for causing all the retained magnetic domains to approach the readout position is supplied to the magnetic member 52. As a result, the magnetic member 52 allows a magnetic domain next to the most recently read magnetic domain to be readable.

Thereafter, the readout processing and the supply of the shift pulse current are alternately performed in the magnetic member 52. Then, when the magnetic domain written at the tail position reaches the readout position, all the magnetic domains are read from the magnetic member 52.

As described above, the magnetic domains of the magnetic member 52 are sequentially read while the retained magnetic domains are sequentially shifted in the direction toward the readout position. In the magnetic member 52, the shift directions of the magnetic domains are different between the write time and the read time. Therefore, in the magnetic member 52, the shift pulse currents in different directions flow at the write time and the read time.

Figure 7:
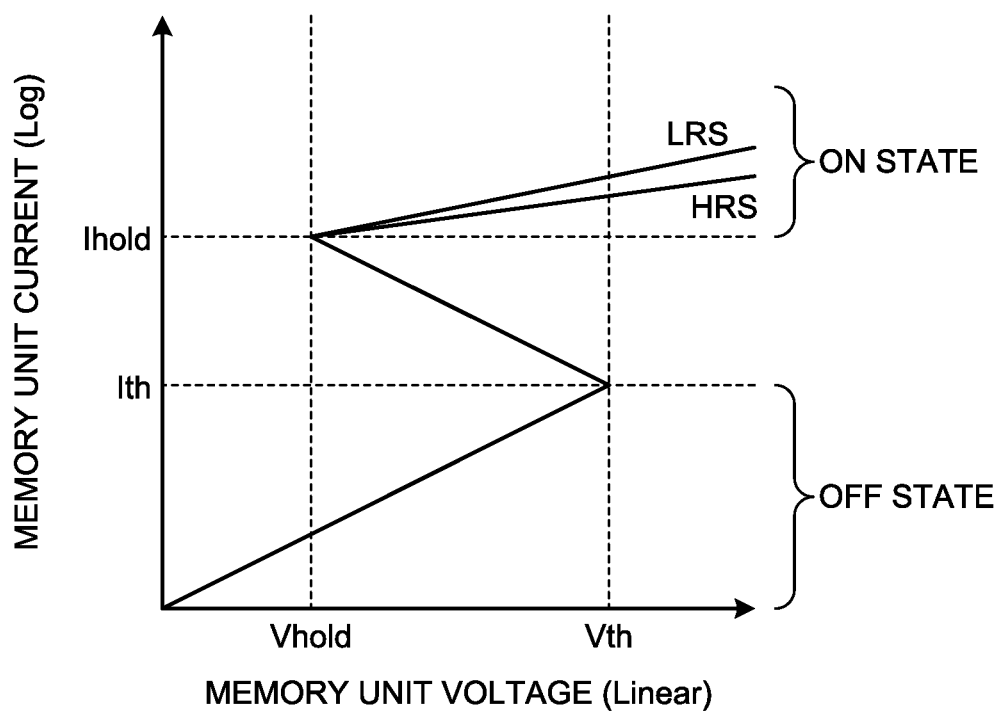
FIG. 7 is a diagram illustrating characteristics of a voltage applied to a memory unit and a current flowing through the memory unit.

FIG. 7 is a diagram illustrating characteristics of a voltage applied to the memory unit 50 and a current flowing through the memory unit 50.

In an initial state where the memory unit voltage applied to the memory unit 50 is 0 and the memory unit current flowing through the memory unit 50 is 0, the selector element 54 is in the off state. Assume that the memory unit voltage gradually increases in the off state of the selector element 54. In this case, the selector element 54 maintains the off state until the memory unit voltage reaches a predetermined threshold voltage value ($V_{th}$). However, when the memory unit voltage becomes equal to or larger than the threshold voltage value ($V_{th}$) and the memory unit current becomes equal to or larger than a threshold current value ($I_{th}$), the selector element 54 changes from the off state to the on state.

When the selector element 54 changes from the off state to the on state, the resistance value of the selector element 54 abruptly decreases. Therefore, when the selector element 54 changes from the on state to the off state, the memory unit voltage steeply falls to a holding voltage value ($V_{hold}$). Meanwhile, the memory unit current steeply rises to the holding current value ($I_{hold}$).

The selector element 54 maintains the on state when the current equal to or larger than the holding current value ($I_{hold}$) continues to flow in the on state. However, when the flowing current becomes smaller than the holding current value ($I_{hold}$), the selector element 54 cannot maintain the on state and changes to the off state.

Further, the magnetoresistance effect element 56 has a different resistance value according to the recorded magnetization direction. For example, the magnetoresistance effect element 56 enters the low resistance state (LRS) in the case being magnetized in the first direction, and enters the high resistance state (HRS) in the case of being magnetized in the second direction opposite to the first direction. Therefore, the memory unit 50 has different voltage-current characteristics depending on whether the magnetoresistance effect element 56 is in the low resistance state (LRS) or in the high resistance state (HRS), in the on state.

Therefore, the readout control circuit 34 can detect the magnetization direction stored by the magnetoresistance effect element 56 by applying a constant voltage to the memory unit 50 and measuring a value of a flowing current in the on state of the selector element 54. Alternatively, the readout control circuit 34 can detect the magnetization direction stored by the magnetoresistance effect element 56 by applying a constant current to the memory unit 50 and measuring a value of an applied voltage in the on state of the selector element 54.

Figure 8:
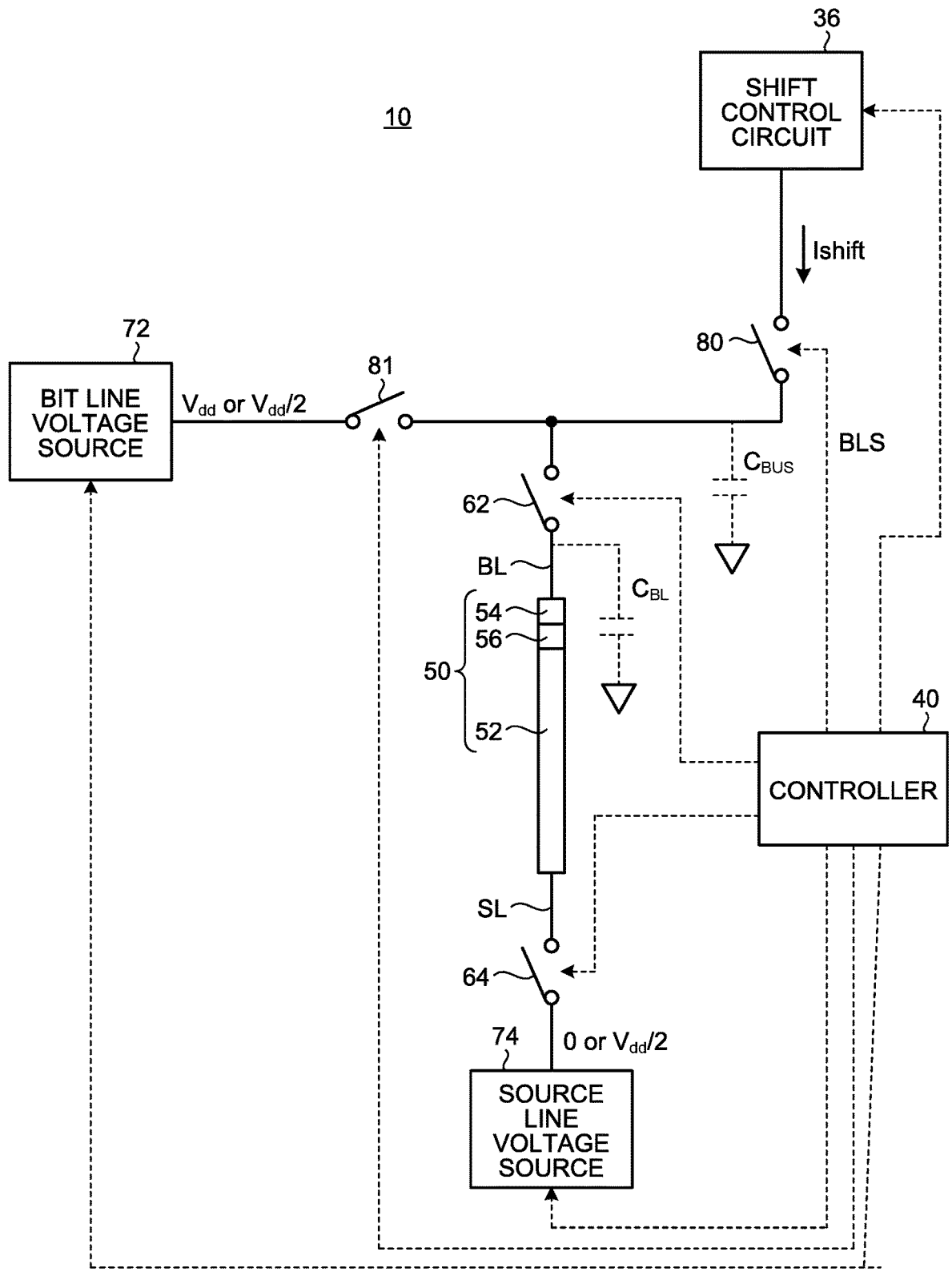
FIG. 8 is a block diagram illustrating a configuration for causing a shift pulse current to flow through a target memory unit.

FIG. 8 is a block diagram illustrating a configuration for causing the shift pulse current to flow through the target memory unit 50. As a configuration for causing the shift pulse current to flow through the target memory unit 50, the magnetic storage device 10 includes a switch 62, a source line switch 64, the shift control circuit 36, a bit line voltage source 72, a source line voltage source 74, a shift current switch 80, a voltage source switch 81, and the controller 40.

The bit line voltage source 72 generates a voltage (a first power supply voltage ($V_{DD}$) or a second power supply voltage ($V_{DD}/2$)) to be applied to a terminal on the side of the bit line BL in the memory unit 50. The bit line voltage source 72 switches and generates the first power supply voltage ($V_{DD}$) or the second power supply voltage ($V_{DD}/2$) according to the control of the controller 40.

The source line voltage source 74 generates a voltage (a ground voltage (0) or the second power supply voltage ($V_{00}/2$)) to be applied to a terminal on the side of the source line SL in the memory unit 50. The source line voltage source 74 switches and generates the ground voltage (0) or the second power supply voltage ($V_{DD}/2$) according to the control of the controller 40.

The switch 62 connects or disconnects the bit line BL to which the target memory unit 50 is connected and the bit line voltage source 72. The switch 62 may be one switch element of a multiplexer for switching connection between the plurality of bit lines BL and the bit line voltage source 72. This multiplexer is, for example, controlled to be switched in response to a selection operation by the bit line decoder 22.

The source line switch 64 connects or disconnects the source line SL to which the target memory unit 50 is connected and the source line voltage source 74. The source line switch 64 may be one switch element of a multiplexer that switches connection between the plurality of source lines SL and the source line voltage source 74. This multiplexer is, for example, controlled to be switched in response to a selection operation by the source line decoder 24.

The shift control circuit 36 supplies the shift pulse current ($I_{shift}$) to the magnetic member 52 included in the target memory unit 50 via the selector element 54 to shift the magnetic domains retained in the magnetic member 52 in the length direction. The shift pulse current is the amount of current that shifts all the magnetic domains retained in the magnetic member 52 by the length of one magnetic domain.

In a case of reading the magnetization direction of the magnetic domain retained in the magnetic member 52, the shift control circuit 36 supplies, to the magnetic member 52, the shift pulse current for shifting the magnetic domains retained in the magnetic member 52 to approach the readout position. In the case of reading the magnetization direction of the magnetic domain retained in the magnetic member 52, the readout control circuit 34 supplies a readout current to the magnetoresistance effect element 56 included in the target memory unit 50 via the bit line BL in the state where the predetermined constant voltage is applied to the memory unit 50 after the magnetic domains are shifted by the length of one magnetic domain. Then, the readout control circuit 34 detects the amount of current of the readout current. As a result, the readout control circuit 34 can acquire information of the magnetization direction of the magnetic domain retained at the readout position.

Further, in a case of writing the magnetic domain in the magnetization direction according to the recording information to the magnetic member 52, the shift control circuit 36 supplies, to the magnetic member 52, the shift pulse current for shifting the magnetic domains retained in the magnetic member 52 away from the write position. Then, in a case of writing the magnetic domain in the magnetization direction according to the recording information to the magnetic member 52, the write control circuit 32 supplies the write current according to the recording information to the field line FL connected to the target memory unit 50 after the magnetic domains are shifted by the length of one magnetic domain. As a result, the write control circuit 32 can write the magnetic domain in the magnetization direction according to the recording information to the write position in the magnetic member 52.

The shift current switch 80 is provided between the shift control circuit 36 (current supply circuit) and the selector element 54 included in the memory unit 50. The shift current switch 80 electrically connects or disconnects the shift control circuit 36 and the selector element 54 according to the control of the controller 40. In the present embodiment, the shift current switch 80 is electrically connected to the selector element 54 via the switch 62. Therefore, the shift current output from the shift control circuit 36 is supplied to the memory unit 50 in a case where both the switch 62 and the shift current switch 80 are in the connected state.

The voltage source switch 81 is provided between the bit line voltage source 72 and the selector element 54 included in the memory unit 50. The voltage source switch 81 electrically connects or disconnects the voltage source switch 81 and the memory unit 50 according to the control of the controller 40. In the present embodiment, the voltage source switch 81 is electrically connected to the selector element 54 via the switch 62. Therefore, the voltage generated from the bit line voltage source 72 is applied to the selector element 54 in a case where both the switch 62 and the voltage source switch 81 are in the connected state.

The controller 40 executes switching control of the switch 62 and the source line switch 64. Further, the controller 40 executes control of switching between the shift current switch 80 and the voltage source switch 81. Further, the controller 40 executes operation control of the shift control circuit 36.

For example, the controller 40 applies a voltage for changing the selector element 54 from the off state to the on state to the memory unit 50 with the switch 62 in the disconnected state, and after the selector element 54 is changed to the on state, the controller 40 sets the switch 62 to be in the connected state. Then, the controller 40 causes the shift control circuit 36 to supply the shift pulse current to the memory unit 50 after setting the switch 62 to be in the connected state or at the same time with setting the switch 62 to be in the connected state.

Here, a bit line parasitic capacitance $C_{BL}$ and a bus line parasitic capacitance $C_{BUS}$ exist in the magnetic storage device 10. The bit line parasitic capacitance $C_{BL}$ is a parasitic capacitance of wiring between the switch 62 and the target memory unit 50. The bus line parasitic capacitance $C_{BUS}$ is a parasitic capacitance of wiring between the switch 62, and the shift current switch 80 and the voltage source switch 81.

Therefore, by the above control, the controller 40 can cause the spike current to flow through the selector element 54, the spike current being generated only from a charge accumulated in the bit line parasitic capacitance $C_{BL}$ as a generation source, in the case of changing the selector element 54 from the off state to the on state. That is, the controller 40 can remove the charge accumulated in the bus line parasitic capacitance $C_{BUS}$ from the spike current. Therefore, the controller 40 can reduce the spike current generated in the case of changing the selector element 54 from the off state to the on state.

Further, before applying the voltage for changing the selector element 54 from the off state to the on state to the memory unit 50, the controller 40 may apply a precharge voltage to the memory unit 50 with both the switch 62 and the voltage source switch 81 in the connected state. The precharge voltage is a voltage value at which the selector element 54 does not change to the on state in a case of being applied to the memory unit 50 in the off state of the selector element 54, and a voltage value at which a current equal to or larger than the holding current value flows through the selector element 54 in a case of being applied to the memory unit 50 in the on state of the selector element 54. With the application, the controller 40 can cause the bit line parasitic capacitance $C_{BL}$ and the bus line parasitic capacitance $C_{BUS}$ to accumulate charges for generating the precharge voltage before the selector element 54 enters the on state.

Further, the controller 40 sets both the switch 62 and the shift current switch 80 to the connected state to cause the shift control circuit 36 to output the shift pulse current after the selector element 54 changes to the on state and before the voltage of the memory unit 50 falls below the holding voltage value ($V_{hold}$). The holding voltage value ($V_{hold}$) is a voltage value at which a current equal to or larger than the holding current value flows through the selector element 54 in a case of being applied to the memory unit 50 in the on state of the selector element 54. Thereby, the controller 40 can cause the selector element 54 to supply a current for maintaining the on state of the selector element 54 before the selector element 54 changes to the off state.

Further, after causing the shift pulse current to be supplied, the controller 40 causes the write control circuit 32 or the readout control circuit 34 (not illustrated in FIG. 8) to perform the write processing or the readout processing.

More specifically, in the case of reading the magnetization direction of the magnetic domain retained in the magnetic member 52, the controller 40 causes the readout control circuit 34 to acquire the information of the magnetization direction after the shift pulse current is supplied to the magnetic member 52. Further, in the case of writing the magnetic domain in the magnetization direction according to the recording information to the magnetic member 52, the controller 40 causes the write control circuit 32 to write the magnetic domain in the magnetization direction according to the recording information to the magnetic member 52 after the shift pulse current is supplied to the magnetic member 52.

Figure 9:
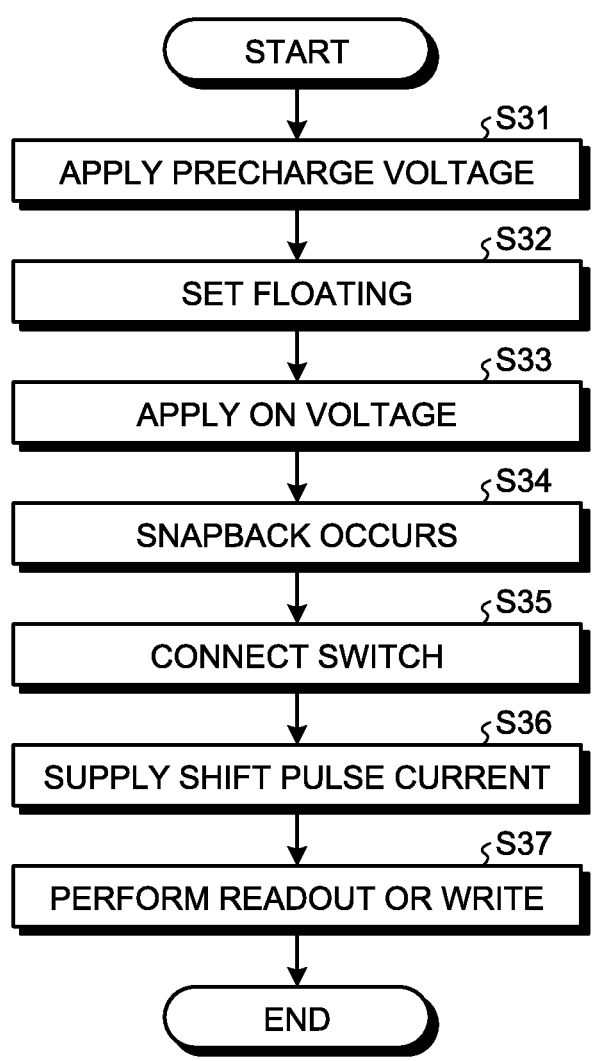
FIG. 9 is a flowchart illustrating a flow of processing by a controller.

FIG. 9 is a flowchart illustrating a flow of processing by the controller 40. After switching the switch 62 and the source line switch 64 connected to the target memory unit 50 to the on state, the controller 40 executes the processing in the flow illustrated in FIG. 9.

In an initial state, the selector element 54 included in the target memory unit 50 is in the off state. Further, the first power supply voltage ($V_{DD}$) is equal to or larger than the threshold voltage value ($V_{th}$) at which the selector element 54 can be transitioned from the off state to the on state. Further, the second power supply voltage ($V_{DD}/2$) is lower than the threshold voltage value ($V_{th}$) and higher than the holding voltage value ($V_{hold}$) that allows a current equal to or larger than the holding current value ($I_{hold}$) to flow in the on state of the selector element 54.

Figure 10:
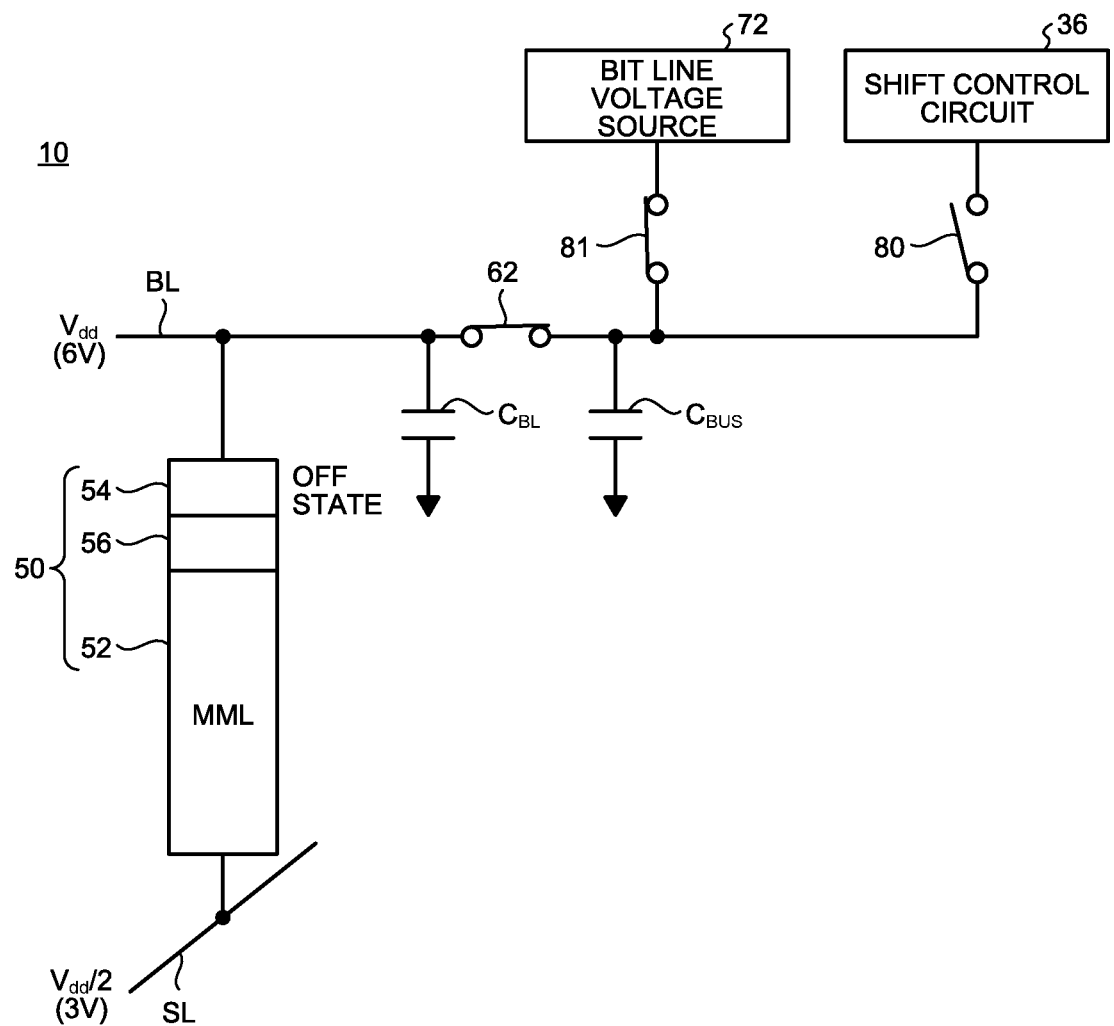
FIG. 10 is a diagram illustrating a bit line voltage, a source line voltage, and a state of a switch at the time of precharge.

First, in S31, the controller 40 applies the precharge voltage to the memory unit 50 with the switch 62 in the connected state. FIG. 10 is a diagram illustrating a bit line voltage, a source line voltage, and a state of the switch 62 at the time of precharge. In S31, as illustrated in FIG. 10, the controller 40 applies the first power supply voltage ($V_{DD}$) (for example, 6 V) to the bit line BL and the second power supply voltage ($V_{DD}/2$) (for example, 3 V) to the source line SL.

With the application, a precharge voltage ($V_{DD}-(V_{DD}/2)$ $=V_{DD}/2$) is applied to the memory unit 50. When the precharge voltage is applied to the memory unit 50, the precharge voltage is also applied to the bit line parasitic capacitance $C_{BL}$ and the bus line parasitic capacitance $C_{BUS}$. With the application, the controller 40 can cause the bit line parasitic capacitance $C_{BL}$ and the bus line parasitic capacitance $C_{BUS}$ to accumulate charges for generating the precharge voltage before the selector element 54 enters the on state.

Figure 11:
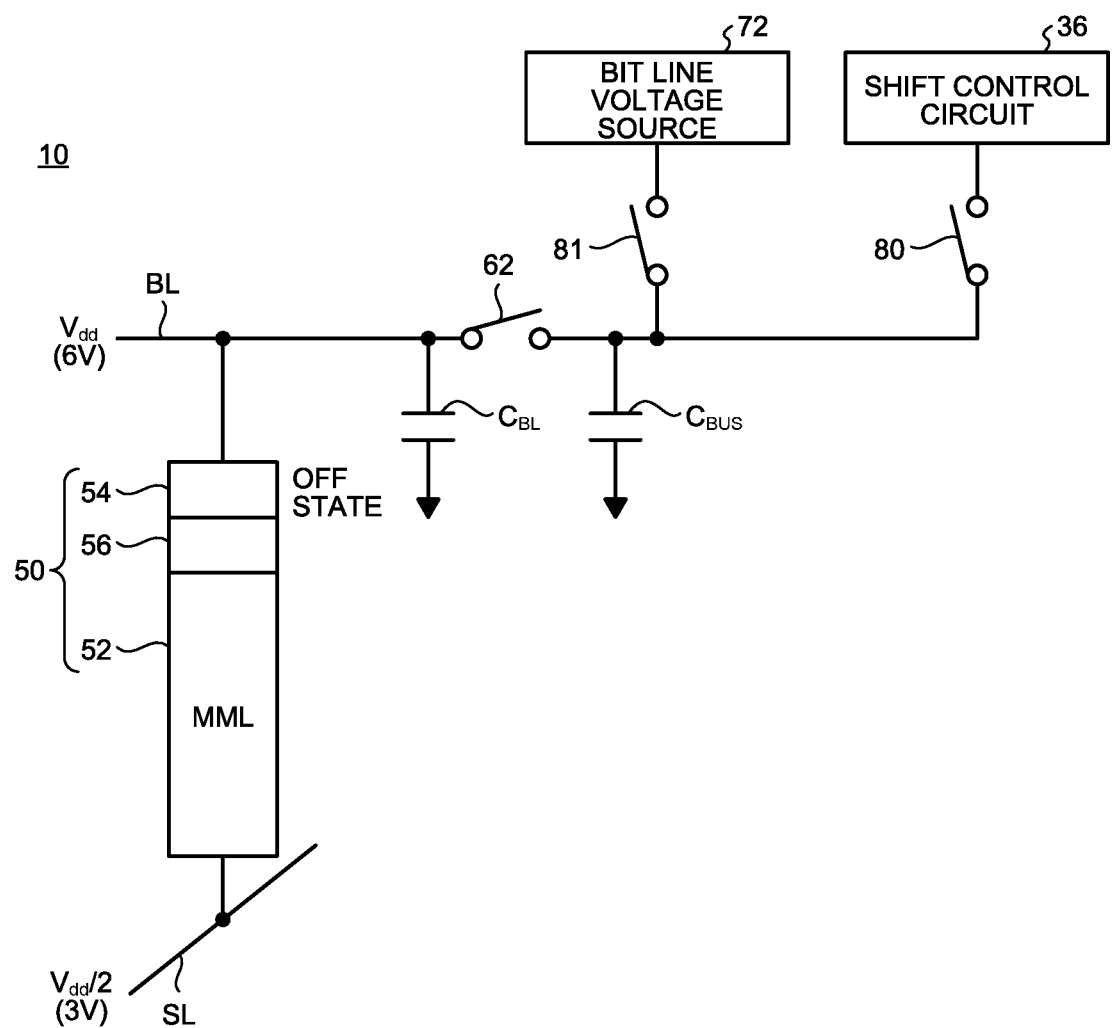
FIG. 11 is a diagram illustrating a bit line voltage, a source line voltage, and a state of a switch at the time of floating.

Next, in S32, the controller 40 sets the switch 62 to be in the disconnected state to bring the memory unit 50 into a floating state from the shift control circuit 36. FIG. 11 is a diagram illustrating a bit line voltage, a source line voltage, and a state of the switch 62 at the time of floating. At the time of floating, the controller 40 applies the first power supply voltage ($V_{DD}$) to the bit line BL and continues to apply the second power supply voltage ($V_{DD}/2$) to the source line SL, for example.

Figure 12:
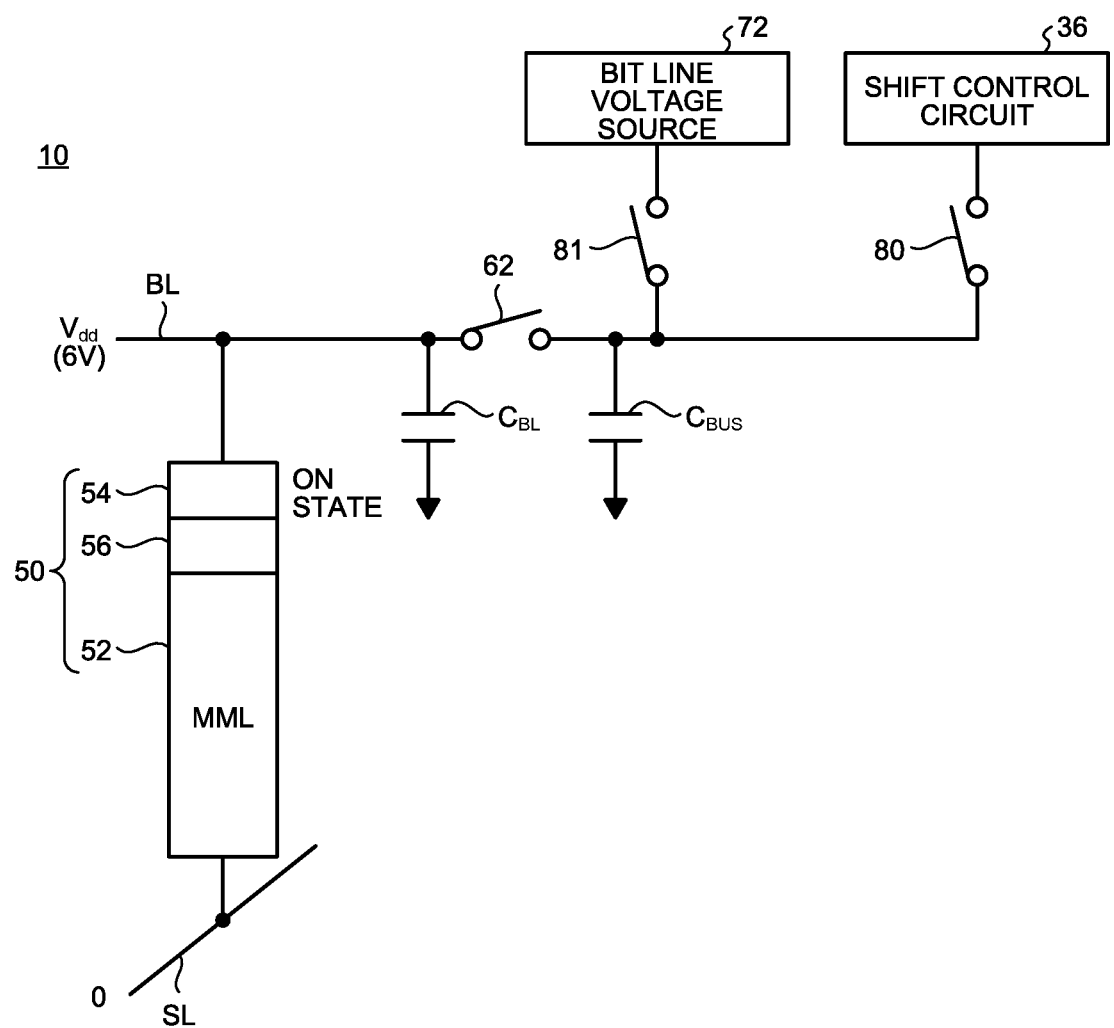
FIG. 12 is a diagram illustrating a bit line voltage, a source line voltage, and a state of a switch at the time of applying an on voltage.

Next, in S33, the controller 40 applies the voltage (on voltage) for changing the selector element 54 from the off state to the on state to the memory unit 50 with the switch 62 in the disconnected state. FIG. 12 is a diagram illustrating a bit line voltage, a source line voltage, and a state of the switch 62 at the time of applying the on voltage. In S33, as illustrated in FIG. 12, the controller 40 applies the first power supply voltage ($V_{DD}$) to the bit line BL and the ground voltage (0) to the source line SL. With the application, the selector element 54 included in the memory unit 50 changes from the off state to the on state.

Figure 13:
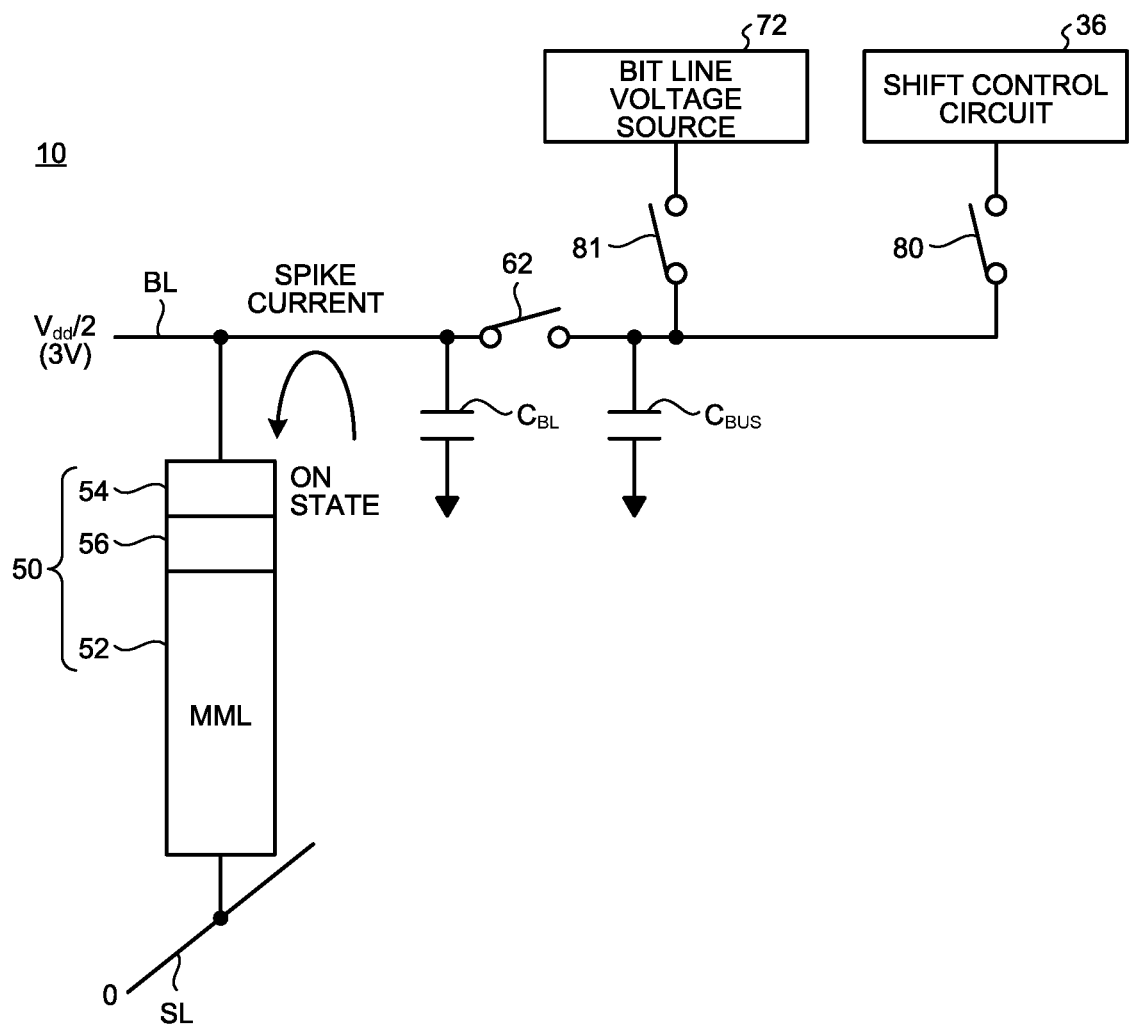
FIG. 13 is a diagram illustrating a bit line voltage, a source line voltage, and a state of a switch at the time of snapback.

Next, in S34, the controller 40 waits for a snapback period. FIG. 13 is a diagram illustrating a bit line voltage, a source line voltage, and a state of the switch 62 at the time of snapback. When the selector element 54 changes from the off state to the on state, the resistance value of the selector element 54 abruptly decreases. As a result, the spike current having the charge accumulated in the bit line parasitic capacitance $C_{BL}$ as the generation source flows into the memory unit 50. Further, since the charge for generating the precharge voltage ($V_{DD}/2$) is accumulated in the bit line parasitic capacitance $C_{BL}$, the bit line BL becomes the second power supply voltage ($V_{DD}/2$) and the source line SL becomes the ground voltage (0).

Figure 14:
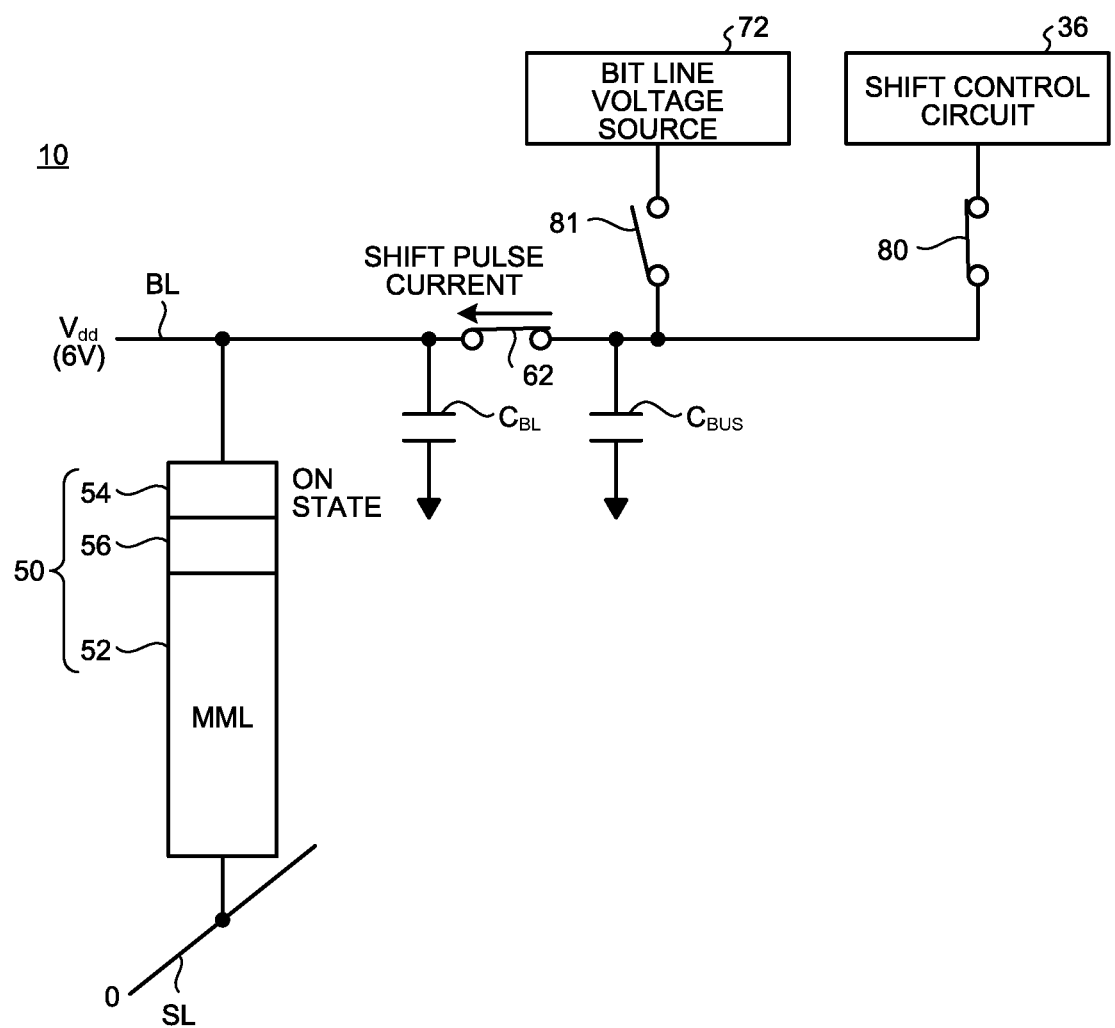
FIG. 14 is a diagram illustrating a bit line voltage, a source line voltage, and a state of a switch at the time of shifting.

Next, in S35, the controller 40 sets the switch 62 to be in the connected state and the switch 62 to be in the connected state. Then, the controller 40 causes the shift control circuit 36 to supply the shift pulse current to the memory unit 50 at the same time with or after setting the switch 62 to be in the connected state. FIG. 14 is a diagram illustrating a bit line voltage, a source line voltage, and a state of the switch 62 at the time of shifting. Thereby, a sufficient current for maintaining the on state of the selector element 54 is supplied to the memory unit 50. Further, since the bit line parasitic capacitance $C_{BL}$ is also charged, the bit line BL becomes the first power supply voltage ($V_{DD}$) and the source line SL becomes the ground voltage (0).

Next, in S36, the controller 40 causes the write control circuit 32 or the readout control circuit 34 to perform the write processing or the readout processing.

The controller 40 executes the above processing from S31 to S36 every time selecting the target memory unit 50. By the processing, the controller 40 can make the generated spike current small in the case of reading or writing information from or to a plurality of the memory units 50 included in the memory unit array 20.

Figure 15:
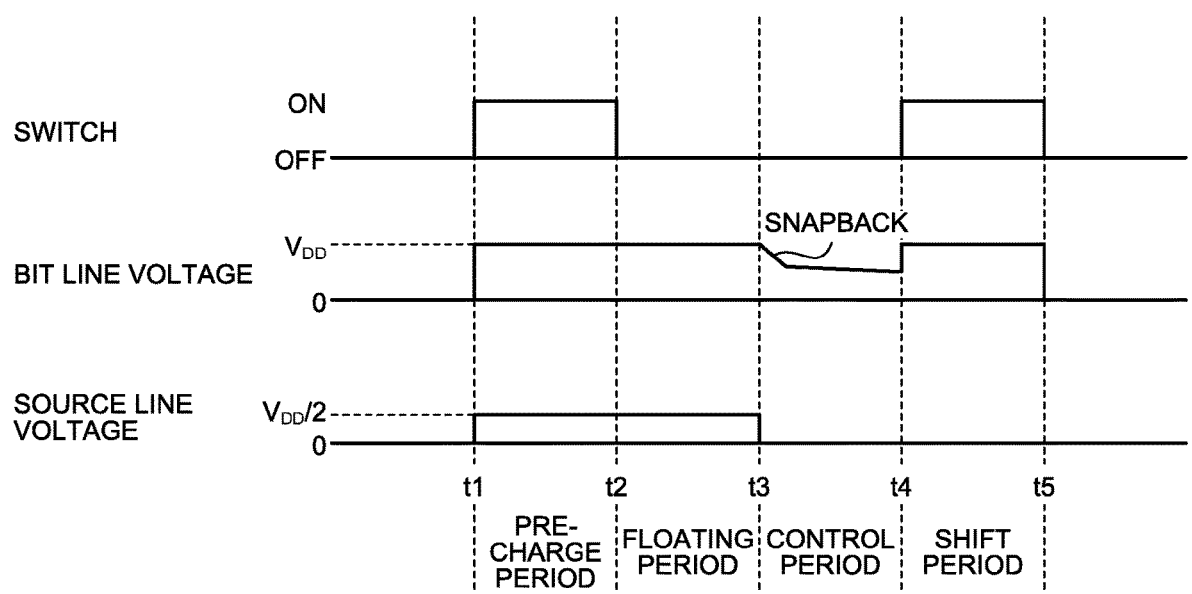
FIG. 15 is a diagram illustrating temporal change in a state of the switch, a bit line voltage, and a source line voltage.

FIG. 15 is a diagram illustrating temporal change in the state of the switch 62, the bit line voltage, and the source line voltage. As described above, the controller 40 applies the precharge voltage ($V_{DD}/2$) to the memory unit 50 (time t1 to t2) with the switch 62 in the connected state (ON). Next, the controller 40 applies the precharge voltage ($V_{DD}/2$) to the memory unit 50 (time t2 to t3) with the switch 62 in the disconnected state (OFF).

Next, the controller 40 sets the switch 62 to be in the disconnected state (OFF) and applies the on voltage ($V_{DD}$) to the memory unit 50 (time t3 to t4). When the on voltage is applied, a snapback occurs, and the bit line voltage momentarily drops. Then, the controller 40 sets the switch 62 to be in the connected state, and causes the shift control circuit 36 to supply the shift pulse current to the memory unit 50 after or at the same time with setting the switch 62 to be in the connected state (time t4 to t5).

By causing the shift pulse current to flow in such a procedure, the magnetic storage device 10 can cause the spike current to flow through the selector element 54, the spike current being generated only from the charge accumulated in the bit line parasitic capacitance $C_{BL}$ as the generation source, to remove the charge accumulated in the bus line parasitic capacitance $C_{BUS}$ from the spike current, in the case of changing the selector element 54 from the off state to the on state. Therefore, according to the magnetic storage device 10, the spike current generated when the selector element 54 changes from the off state to the on state can be reduced.

Note that the controller 40 supplies the shift pulse current to the memory unit 50 after or at the same time with setting the switch 62 to be in the connected state after the selector element 54 changes from the off state to the on state. In place of the operation, the controller 40 may cause another current supply circuit to supply the current to the memory unit 50. For example, the controller 40 may cause the readout control circuit 34 to output a readout current or cause another current supply circuit for holding the on state of the selector element 54 to supply the current.

Further, in the above embodiments, the cases where the switch element between two terminals is applied as the selector element 54 have been described. However, a metal oxide semiconductor (MOS) transistor or a FIN transistor, such as a field effect transistor that is a switch element between three terminals, may be applied as the selector element 54. A diode element may also be applied. That is, the memory unit array 20 is not limited to the cross-point type structure, and any arbitrary array structure can be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
a memory unit including a magnetic member that includes a portion extending in a direction and including a switch element that is connected in series to the magnetic member and that changes to an on state in a case where a voltage equal to or larger than a predetermined value is applied in an off state;
a current supply circuit configured to supply a current to the memory unit;
a switch configured to electrically connect or disconnect the current supply circuit and the memory unit; and
a controller configured to apply a voltage for changing the switch element from the off state to the on state to the memory unit with the switch in a disconnected state, and set the switch to be in a connected state after the switch element changes to the on state.

2. The magnetic storage device according to claim 1, wherein
the controller causes the current supply circuit to supply the current to the memory unit at the same time with or after setting the switch to be in the connected state.

3. The magnetic storage device according to claim 2, wherein
the switch element maintains the on state in a case where a current equal to or larger than a holding current value continues to flow in the on state,
the controller applies a precharge voltage to the memory unit with the switch in the connected state before applying the voltage for changing the switch element from the off state to the on state to the memory unit, and
the precharge voltage is a voltage value at which the switch element does not change to the on state in a case of being applied to the memory unit in the off state of the switch element, and at which the current equal to or larger than the holding current value flows through the switch element in a case of being applied to the memory unit in the on state of the switch element.

4. The magnetic storage device according to claim 3, wherein
the controller sets the switch to be in the connected state before a voltage of the memory unit falls below a holding voltage value after the switch element changes to the on state, and
the holding voltage value is a voltage value at which the current equal to or larger than the holding current value flows through the switch element in a case of being applied to the memory unit in the on state of the switch element.

5. The magnetic storage device according to claim 1, wherein
The portion of the magnetic member has a cylindrical shape.

6. The magnetic storage device according to claim 5, wherein
the magnetic member is able to retain a plurality of magnetic domains in a length direction, and moves the retained magnetic domains in response to a current flowing in the length direction.

7. The magnetic storage device according to claim 6, wherein
the switch element is electrically connected to an end portion of the magnetic member in the length direction.

8. The magnetic storage device according to claim 6, wherein
the current supply circuit includes a shift control circuit that supplies a shift pulse current to the magnetic member via the switch element to shift a magnetic domain retained in the magnetic member in the length direction.

9. The magnetic storage device according to claim 8, wherein
the shift pulse current is an amount of current that shifts all of magnetic domains retained in the magnetic member by a length of one magnetic domain.

10. The magnetic storage device according claim 9, wherein
the memory unit further includes a readout element that reads a magnetization direction of a magnetic domain retained at a readout position in the magnetic member, and
the shift control circuit supplies the shift pulse current in a direction shifting the magnetic domain retained in the magnetic member to approach the readout position in a case of reading the magnetization direction of the magnetic domain retained in the magnetic member.

11. The magnetic storage device according to claim 10, wherein
the readout element is a magnetoresistance effect element.

12. The magnetic storage device according to claim 10, further comprising:
a readout control circuit configured to supply a current to the readout element and acquire information of the magnetization direction of the magnetic domain read by the readout element, wherein
the controller causes the readout control circuit to acquire the information of the magnetization direction read by the readout element after the shift pulse current is supplied to the magnetic member.

13. The magnetic storage device according to claim 11, wherein
the magnetoresistance effect element is provided between the switch element and the magnetic member.

14. The magnetic storage device according to claim 13, wherein
the magnetoresistance effect element is a magnetic tunnel junction (MTJ) element.

15. The magnetic storage device according to claim 1, further comprising:
a write element that writes a magnetic domain in a magnetization direction according to recording information to a write position in the magnetic member, wherein
the shift control circuit supplies the shift pulse current for shifting the magnetic domain retained in the magnetic member in a direction away from the write position in a case of writing the magnetic domain to the magnetic member.

16. The magnetic storage device according to claim 15, wherein
the write element includes a field line through which a current flows.

17. The magnetic storage device according to claim 16, wherein
the write element writes a new magnetic domain to the write position by a magnetic field caused by the current flowing through the field line.

18. The magnetic storage device according to claim 17, further comprising:
a write control circuit configured to supply a current to the write element, wherein
the controller causes the write control circuit to write the magnetic domain in the magnetization direction according to the recording information to the magnetic member every time the shift pulse current is supplied to the magnetic member.

19. The magnetic storage device according to claim 1, further comprising:
a readout element that reads a magnetization direction of a magnetic domain retained at a readout position in the magnetic member; and
a write element that writes a magnetic domain in a magnetization direction according to recording information to a write position in the magnetic member, wherein
the readout position and the write position are formed at one end portion of the magnetic member, and
the shift control circuit causes the shift pulse current in a different direction to flow between a case of reading the magnetization direction of the magnetic domain retained in the magnetic member and a case of writing the magnetic domain to the magnetic member.

20. A magnetic storage device comprising:
a memory unit including a magnetic member that includes a portion extending in a direction and including a switch element that is connected in series to the magnetic member and that changes to an on state in a case where a voltage equal to or larger than a predetermined value is applied in an off state;
a readout element that reads a magnetization direction of a magnetic domain retained at a readout position in the magnetic member;
a readout control circuit configured to supply a current to the readout element and acquires information of the magnetization direction of the magnetic domain read by the readout element;
a write element that writes a magnetic domain in a magnetization direction according to recording information to a write position in the magnetic member;
a write control circuit configured to supply a current to the write element;
a current supply circuit configured to supply a current to the memory unit;
a switch configured to electrically connect or disconnect the current supply circuit and the memory unit; and
a controller configured to apply a voltage for changing the switch element from the off state to the on state to the memory unit with the switch in a disconnected state, and set the switch to be in a connected state after the switch element changes to the on state.

* * * * *